United States Patent [19]
Yagi et al.

[11] 3,946,422
[45] Mar. 23, 1976

[54] ELECTRET TRANSDUCER HAVING AN ELECTRET OF INORGANIC INSULATING MATERIAL

[75] Inventors: Hajime Yagi, Tokyo; Yoshihiro Saito, Machida; Koji Hirano, Yokohama, all of Japan

[73] Assignee: Sony Corporation, Tokyo, Japan

[22] Filed: May 30, 1974

[21] Appl. No.: 474,657

Related U.S. Application Data

[63] Continuation of Ser. No. 311,472, Dec. 4, 1972, abandoned.

[30] Foreign Application Priority Data

Dec. 2, 1971  Japan.................................. 46-97436

[52] U.S. Cl.................. 357/26; 357/23; 179/110 B; 307/88 ET; 340/173 R
[51] Int. Cl.².................... H01L 29/84; H01L 29/96
[58] Field of Search ........... 357/23, 26; 179/110 A, 179/111, 121; 307/88 ET; 29/195; 340/173

[56] References Cited
UNITED STATES PATENTS

| | | | |
|---|---|---|---|
| 3,300,585 | 1/1967 | Reedyk et al.......................... | 357/26 |
| 3,400,383 | 9/1968 | Meadows et al...................... | 357/26 |
| 3,436,492 | 4/1969 | Reedyk................................... | 357/26 |
| 3,449,094 | 6/1969 | Baxt et al.......................... | 307/88 ET |
| 3,624,312 | 11/1971 | Koukal............................. | 307/88 ET |
| 3,701,865 | 10/1972 | Carlson et al.......................... | 357/26 |
| 3,740,496 | 6/1973 | Carlson et al.......................... | 357/26 |
| 3,742,152 | 6/1973 | Lewiner et al. .................. | 179/111 E |
| 3,748,727 | 7/1973 | Swain............................... | 307/88 ET |
| 3,786,495 | 1/1974 | Spence............................. | 340/365 C |

FOREIGN PATENTS OR APPLICATIONS
| | | | |
|---|---|---|---|
| 158,651 | 7/1953 | Australia............................... | 357/26 |

*Primary Examiner*—Andrew J. James
*Attorney, Agent, or Firm*—Lewis H. Eslinger; Alvin Sinderbrand

[57]  ABSTRACT

An electret transducer in which the electret material is an inorganic insulator sheet with electric charges in it and is juxtaposed to an electrode, and either the sheet or the electrode is mechanically deformable to change the distance between the two, thereby changing the electric charge induced in the electrode by the charged electret sheet. In a preferred form, the electret material comprises a multilayer sheet of insulating materials. The method of forming the transducer includes at least the steps of vapor-depositing a thin layer of inorganic material on a substrate and subjecting the exposed surface of the insulating material to a source of electric charge for a time sufficient to implant charges in the insulating material. If the insulating material is to be deformable, it should be deposited on a thin layer of metal which, in turn, has been deposited on a thicker substrate. A spacer layer of metal is deposited on top of the charged insulating material. Thereafter, selected areas of the substrate and of the spacer layer are chemically removed to leave the thin metal layer and the charged insulating material free of support except around the periphery of such open area. The ability of the insulating material to accept and hold a charge may be improved by depositing the insulating material as two separate layers of different materials, one immediately on top of the other.

7 Claims, 12 Drawing Figures

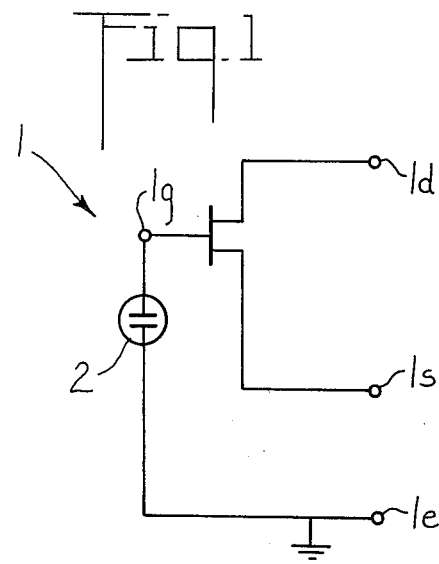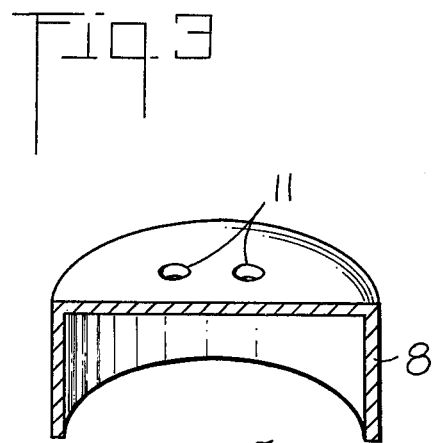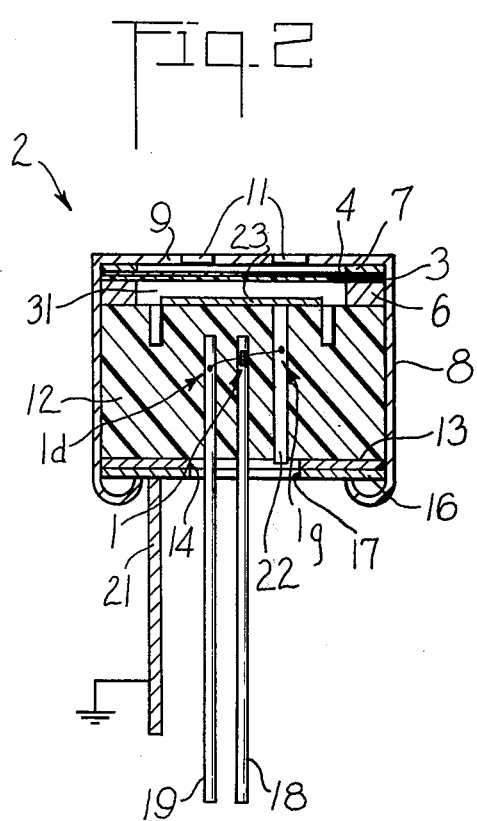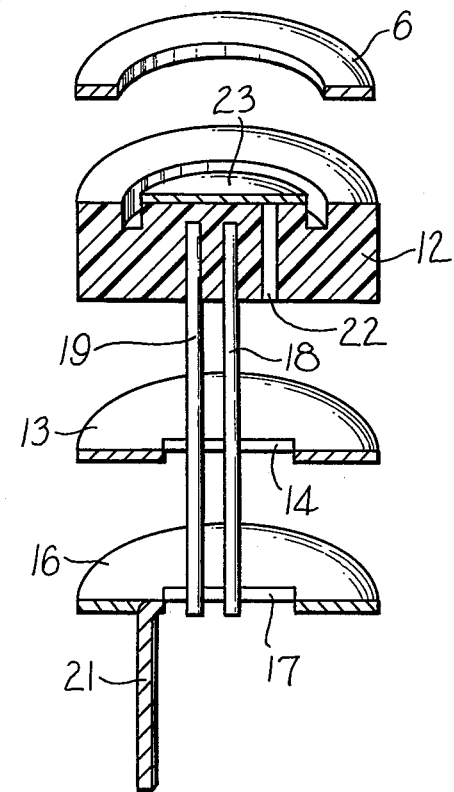

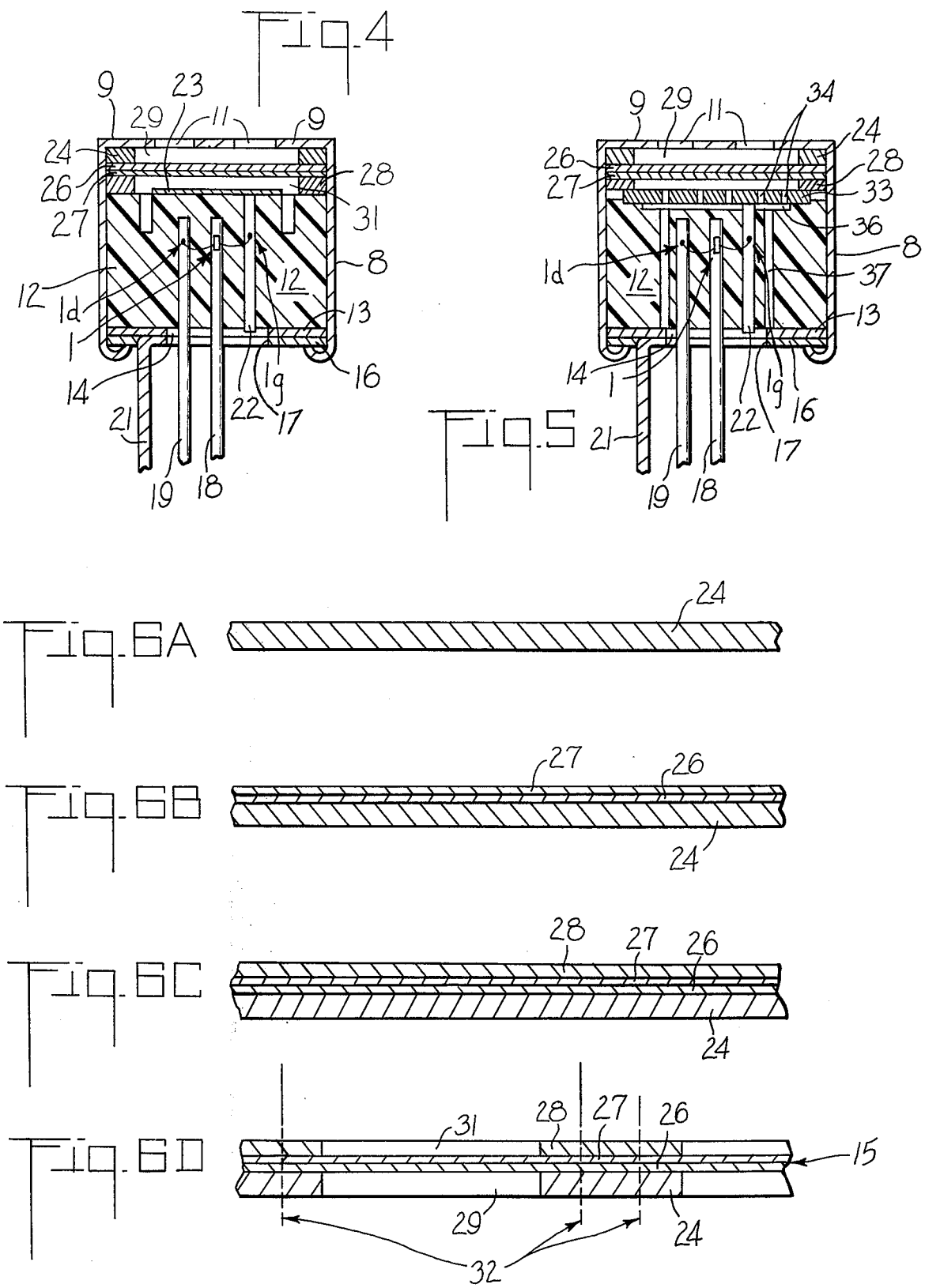

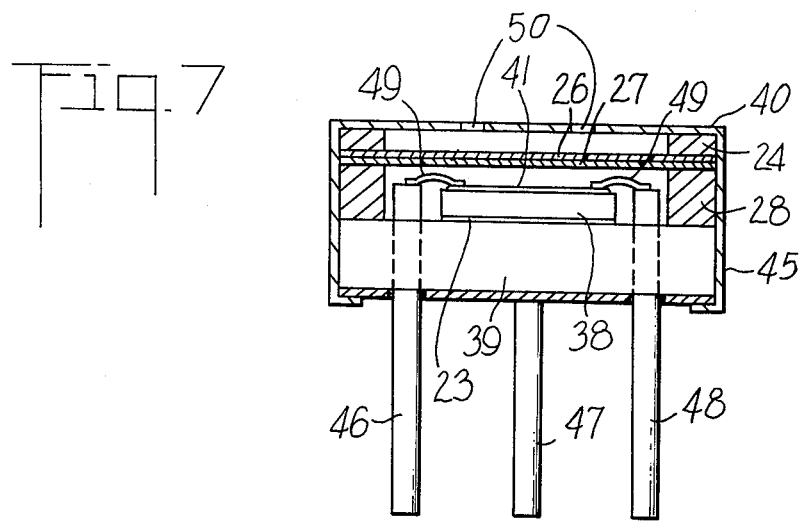
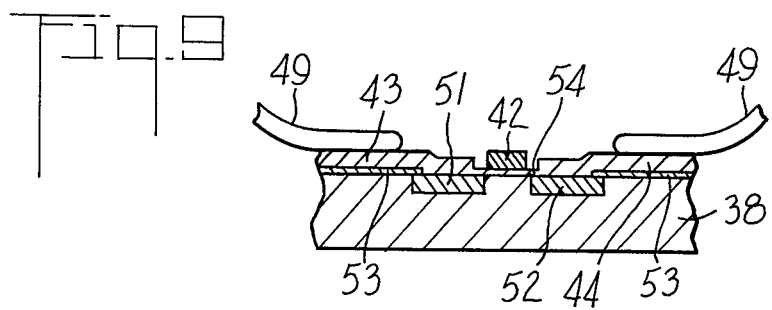
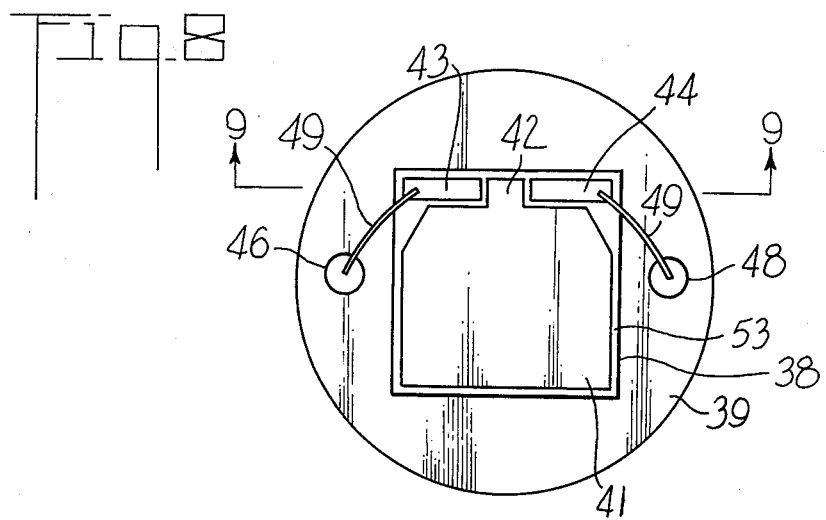

3,946,422

ELECTRET TRANSDUCER HAVING AN ELECTRET OF INORGANIC INSULATING MATERIAL

RELATED APPLICATIONS

This is a continuation of application Ser. No. 311,472, filed Dec. 4, 1972 and now abandoned.

BACKGROUND OF THE INVENTION

1. Field of the Invention

This invention relates to the field of electret transducers, and particularly to a transducer in which the electret material is an inorganic insulator, preferably with more than one layer, and to a method of forming an electret structure suitable for use in a transducer.

2. The Prior Art

Heretofore electret materials have usually been high polymers or other organic materials. In the formation of a complete electret structure, it has been necessary to attach a thin metal layer by means of adhesive to one surface of the insulating material. It is difficult and time consuming to perform this step, particularly in mass production. Furthermore, such organic materials must not be subjected to very high temperatures.

It is one of the objects of the present invention to provide an improved electret structure and a method of making the same.

Another object of this invention is to provide an electret structure comprising inorganic electret material.

A further object of this invention is to provide an electret structure capable of accepting a substantially higher charge per square centimeter than the high polymer electrets in use heretofore.

A still further object of this invention is to provide an electret structure that is resistant to heat.

Further objects will become apparent from the following specification together with the drawing.

BRIEF DESCRIPTION OF THE INVENTION

In accordance with the present invention a layer of a suitable inorganic material is vapor-deposited on the surface of a substrate. After being deposited, the insulating material is charged in any convenient way, such as by subjecting it to electron beam radiation or other charged particle radiation, or by applying a direct voltage between the substrate and the exposed surface of the insulating material or by diffusion of positively charged particles into the surface. The substrate with the charged inorganic electret layer on it may then be incorporated into a transducer that also comprises an electrode in surface-to-surface contact with the electret, and another electrode juxtaposed with respect to the other surface of the electret but spaced from it. Either the electret and the first electrode are deformable with respect to the second electrode or vice versa. If the transducer is to be used as a microphone, the deformation must be responsive to sound pressure. Other types of input transducers may require that the deformation be responsive to mechanical pressure. In the case of an output transducer, the deformation may be in response to electrical force modulated by a voltage applied between the electrodes.

The electret and the electrodes may be enclosed within a housing that can serve as a connection to one of the electrodes. Terminal posts mechanically supported by the housing may serve also to support a field-effect transistor (FET), the base of which is connected to the elctrode that is not connected to the housing.

Alternately, the latter electrode may comprise the gate electrode of a FET.

BRIEF DESCRIPTION OF THE DRAWINGS

FIG. 1 is a circuit diagram of a FET having an electret transducer connected to the input thereof.

FIG. 2 is a cross-sectional view of an electret transducer constructed according to the prior art.

FIG. 3 is a exploded cross-sectional view of the transducer in FIG. 2.

FIG. 4 is a cross-sectional view of one embodiment of an electret transducer according to the present invention.

FIG. 5 is a cross-sectional view of a modified embodiment of a electret transducer according to the present invention.

FIGS. 6A–6D are cross-sectional views of an electret structure at several stages in its manufacture according to the present invention.

FIG. 7 is a cross-sectional view of another embodiment of an electret transducer according to the invention.

FIG. 8 is a top view of the field effect electrode structure in the transducer of FIG. 7.

FIG. 9 is an enlarged cross-sectional view of a fragment of the field-effect structure in FIG. 8 taken along the line 9–9'.

DETAILED DESCRIPTION OF THE INVENTION

An electret transducer is a high impedance device, and when it is used as a microphone, it should work into a high impedance load. The input section of a FET is such a load, and FIG. 1 shows the connections between a FET 1 and an electret transducer 2 in accordance with existing techniques. The FET has three electrodes: a gate, a source, and a drain, and their respective terminals are identified by reference characters $1g$, $1s$, and $1d$. One terminal of the electret transducer 2 is connected to the gate terminal $1g$, and the other terminal of the transducer is connected to a common, or ground, terminal $1e$. Suitable operating voltages and loads are connected to the FET 1 in a known manner.

The electret transducer 2 is shown in greater detail in FIG. 2 and consists of a high polymer electret film 3 that has a fixed electrical charge. A conductive surface film 4 is attached to the upper surface of the film 3, and the combined films 3 and 4 are clamped between a spacer ring 6 and a conductive ring 7 that also serves as a spacer. A cylindrical metallic cap 8 encloses the rings 6 and 7 and has a flat end plate 9 with apertures 11 through which sound waves can reach the films 3 and 4. The plate 9 presses the rings 7 and 6 against a short cylindrical support 12. In the prior art, the support 12 has typically been molded of synthetic resin. An insulating plate 13 having a slot 14 and a metallic shield plate 16 having a slot 17 are pressed against the other end of the cylindrical support 12 by an inwardly turned rim at the lower end of the cylindrical skirt of the cap 8.

The support 12 has two terminal posts 18 and 19 embedded in it and extending away from the transducer. A third terminal post 21 extends from the metalic plate 16 for connection to ground or a common terminal. Within the support 12 is still another terminal 22 that does not extend below the lower end of the support but does make electrical contact with a conductive backplate electrode 23 on top of the support. This backplate electrode is the second electrode of the transducer, and the signal voltage produced by the transducer in operation is produced between the electrode 23 and the conductive film electrode 4. The gate electrode terminal 1g of the FET 1 is connected to the terminal 22 and the source and drain electrodes of the FET are connected to the terminals 18 and 19, respectively.

FIG. 3 shows the elements of FIG. 2 in an exploded view. As may be seen in both FIGS. 2 and 3, the electrode 23 is rigidly supported on the support 12. In operation as a microphone, sound waves pass through the apperatures 11 and cause the combined films 3 and 4 to vibrate in response to the sound. This vibration causes the electret film 3 to move alternately closer to and farther from the electrode 23 and induces a correspondingly varying signal voltage in the electrode 23. This signal voltage is applied to the gate electrode of the FET 1, and an output signal can be derived from the source and drain terminals 18 and 19.

FIG. 4 is a cross-sectional view of an embodiment of an electret transducer in accordance with the present invention. The structure is similar to that shown in FIG. 2 and uses similar reference terminals except for the electret, itself, and the components directly attached to it.

One of the disadvantages of the electrets of the type produced heretofore is that they used high polymer films, such as Mylar or Teflon or the like. It was difficult to assemble these insulating films with a thin conductive metal film in order to form the electret and electrode structure. The conductive film had to be attached by some suitable means such as by an adhesive, which was difficult to do. Furthermore, the combined films then had to be attached to a conductive ring and the spacer ring. Because of the thinness of the films and their characteristics, they were difficult to handle.

FIGS. 6A–6D illustrate certain stages in the manufacture of an electret structure in accordance with the present invention to overcome the difficulties in prior structures. The construction begins with a sheet 24 of a suitable metal thick enough to be handled easily. For example, the sheet 24 may be made of aluminum 2mm. thick. If the electret is to be deformable, as in the case in FIG. 4, a thin layer of another metal resistant to chemical attack is vapor-deposited on one surface of the sheet 24. This second metal layer is indicated by reference numeral 26 in FIG. 6B and may be, for example, gold having a thickness of 0.1 $\mu$. On top of the gold layer 26 is deposited at least one insulating layer 27 that is the electret material. In accordance with the present invention this layer is quite thin, for example, 2000 A, and it may be one of a number of inorganic insulators. We have found, for example, that silicon dioxide, aluminum oxide, titanium dioxide, silicon nitride, and an adduct consisting of phosphorous pentoxide and silicon dioxide are especially suitable for forming the layer 27.

The next step in the process is to electrify the exposed insulating layer 27. This may be done in any one of several ways. For example, the layer may be exposed to an electron beam having a voltage of about 5 kv emanating from an electron gun located about 8 cm. from the surface of the layer 27. This exposure to the electron beam should be continued for approximately 30 minutes and, in the case of a silicon dioxide layer 27, will cause a charge in coulombs of about $-1 \times 10^{12}/cm^2$ to be applied to the layer 27. This is in contrast to a typical charge for high polymer materials according to the prior art. Such materials typically have a stored charge of about $1 \times 10^{11}/cm^2$, which means that the electret film 27 of the present invention has a capability of holding ten times the charge of the electret material of the prior art. Furthermore, the inorganic materials used for making the layer 27 are cheaper and have longer life and are more resistant to heat.

We have further found that utilizing two separate layers of the aforementioned inorganic materials to make the layer 27 gives still further advantages. For example, the layer 27 may be formed by vapor depositing a layer of aluminum oxide having a thickness of approximately 1500 A, and preferably 1700 A, and a layer of silicon dioxide having a thickness of about 100 A to 300 A, and preferably about 200 A, makes it possible to charge the material much more easily. For example, exposure to electrons, from a 70 volt source and for a period of 5 seconds will result in a charge of $-6 \times 10^{12}/cm^2$, which is 6 times as high as the charge in a silicon dioxide layer alone, and is achieved in a small fraction of the time and at a small fraction of the voltage required to charge a silicon dioxide layer. Another combination of two layers that has been found to be particularly satisfactory consists of silicon nitride and silicon dioxide.

The layer 27 may also be charged positively by diffusion of suitable material, such as sodium or potassium into it. After the layer 27, whether it is a single layer or a compound layer, has been electrified, a further layer of metal is vapor-deposited thereover. This latter layer, referred to by reference numeral 28 in FIG. 6C may be, for example, aluminum having a thickness of about 10 $\mu$.

Thereafter, holes 29 and 31 of corresponding size are etched chemically through the outer aluminum layers 24 and 28, respectively, to leave the electret material in the layer 27 and the metal layer 26 free in a central area so that they can easily be deformed by sound pressure or other pressure while still being firmly supported by a ring of the metal 24 and another spacer ring of the metal 28, as shown in FIG. 6D. The sections of the metal layers 24 and 28 may be chemically removed to form a large number of holes in a large composite sheet. Thereafter, individual electret structures may be cut out of the large sheet by cutting along lines indicated by reference numeral 32 to form circular structures each having a diameter that will fit into the metallic cap 8 illustrated in FIGS. 2–5.

FIG. 5 shows an electret transducer in which the backplate electrode is identified by reference numeral 33. It has a plurality of apertures 34 that communicate with a chamber 36 and, via channels 37, with the open slots 14 and 17. This allows the electret 27 and the metal film 26 to move more easily in response to sound vibrations.

FIGS. 7–9 show a modified embodiment in which the FET, instead of being attached to the backplate electrode as a separate entity, incorporates the backplate electrode as part of FET structure.

The FET structure, which may be either a MOS-type or a junction-type, is shown in FIG. 7 as comprising a substrate, or chip, 38 of semiconductor material attached to a header 39 by a suitable eutectic alloy solder. On top of the chip 38 is an electrode 41 that serves as the backplate electrode for the electret layer 27. The latter is joined to the metallic layer 26 and both of these layers are held by the metal spacer rings 28 and 24 between the header 39 and the inner surface of the top 40 of the metal enclosure 45. As in the previous embodiments, the top 40 has a plurality of apertures 50 through which sound waves can pass. Three terminal posts 46–48 extend through the header 39 and are rigidly held by it.

FIG. 8 is a top view of the header 39 and the semiconductor chip 38 with the electrode 41 on it. The electrode 41 is nearly square, except for two beveled corners and a small tab 42 that serves as the gate electrode for the FET structure. The gate 42 extends between the source electrode 43 and the drain electrode 44 of the FET. These two electrodes are connected to the terminals 46 and 48 by means of leads 49.

The FET is shown in FIG. 9 in an enlarged cross-sectional view. The semiconductor chip 38 has a source region 51 and a drain region 52 in its upper surface. The electrodes 43 and 44 make contact with these regions and are insulated by a thin layer 53 of silicon dioxide from direct contact with the surface of the chip 38. Another thin insulating layer 54 prevents the gate electrode from making contact with the chip 38 or the regions 51 and 52.

In operation as a transducer, the main part of the plate electrode 41 picks up a signal from the electret layer 27 as the latter vibrates in response to sound wave pressure. The signal voltage produced on the electrode 41 by the vibrating electret is much greater than it would be if only the small tab 42 were used as the backplate. At the same time, the tab is small enough to fit in with the source and drain electrodes 43 and 44 in a FET structure of usable size.

Although the electret layer 27 has been shown as part of a deformable membrane, it could also be formed on the rigid backplate electrode such as the electrode 41 in FIG. 8. In that case, the deformable membrane 26 may be used alone, and voltage may still be induced between the deformable membrane and the backplate electrode.

What is claimed is:

1. An electret transducer comprising:
    a first member including a sheet of inorganic insulating material having electric charges bound therein and consisting of first and second contiguous layers of material, the material of said first layer being selected from the group consisting of: silicon dioxide, silicon nitride, aluminum oxide, titanium dioxide, and an adduct of phosphorous pentoxide and silicon dioxide and the material of said second layer being selected from the group consisting of silicon dioxide, silicon nitride, aluminum oxide, titanium dioxide, and an adduct of phosphorous pentoxide and silicon dioxide, but being different from said material of said first layer; and
    a second member including an electrode juxtaposed with respect to said sheet and spaced therefrom and parallel thereto, one of said members being movable with respect to the other of said members to vary the electric field induced in said electrode by said electric charge.

2. The electret transducer of claim 1 in which said second member is relatively rigid and said first member is a deformable membrane.

3. The electret transducer of claim 2 in which said sheet of inorganic insulating material is deposited on a conductive substrate.

4. The electret transducer of claim 1 in which said first member is a deformable membrane and comprises, in addition, a conductive layer intimately joined surface-to-surface with said sheet of inorganic insulating material.

5. The electret transucer of claim 1 in which said first layer is of aluminum oxide having a thickness of approximately 1500 A to 2000 A and said second layer is of silicon dioxide having a thickness of 100 A to 300 A.

6. The electret transducer of claim 4 comprising, in addition;
    A. a first metal ring electro-deposited on said conductive layer; and
    B. a second metal ring of the same size as said first metal ring and electro-deposited on said membrane directly in alignment with said first ring, whereby said membrane and said conductive layer are supported by and between said metal rings.

7. The transducer of claim 1 comprising, in addition:
    A. a semiconductive substrate, said other of said members comprising a conductive layer extending over and physically attached to a first area of a surface of said substrate;
    B. a source region in a second area of said surface;
    C. a drain region in a third area of said surface, said second and third areas each being smaller than said first area and spaced apart by a portion of said surface;
    D. an insulating layer over said portion of said surface; and
    E. a conductive tab extending from one edge of said conductive layer and extending over said insulating layer to serve as a gate for said source and drain regions.

* * * * *